United States Patent [19]

Yamaki et al.

[11] Patent Number: 4,962,056

[45] Date of Patent: Oct. 9, 1990

[54] METHOD OF MANUFACTURING FROM A SEMICONDUCTOR WAFER A DIELECTRIC SUBSTRATE INCLUDING MUTUALLY INSULATED AND SEPARATED ISLAND REGIONS, AND A METHOD OF MANUFACTURING SEMICONDUCTOR ELEMENTS FROM THE DIELECTRIC SUBSTRATE

[75] Inventors: Bunshiro Yamaki, Fujisawa; Nobutaka Matsuoka, Yokohama, both of Japan

[73] Assignee: Kabushiki Kaishi Toshiba, Kawasaki, Japan

[21] Appl. No.: 293,283

[22] Filed: Jan. 4, 1989

[30] Foreign Application Priority Data

Jan. 21, 1988 [JP] Japan .................................. 63-9609

[51] Int. Cl.$^5$ ..................... H01L 21/304; H01L 21/84
[52] U.S. Cl. ...................................... 437/62; 437/974; 148/DIG. 12
[58] Field of Search ................ 437/62, 939, 974, 980, 437/226, 227; 148/DIG. 12, DIG. 135

[56] References Cited

U.S. PATENT DOCUMENTS

| | | | |
|---|---|---|---|
| 4,501,060 | 2/1985 | Frye et al. | 437/62 |
| 4,567,646 | 2/1986 | Ishikawa et al. | 437/62 |
| 4,638,552 | 1/1987 | Shimbo | 437/62 |
| 4,851,078 | 7/1989 | Short et al. | 156/632 |

FOREIGN PATENT DOCUMENTS

| | | |
|---|---|---|
| 57-114251 | 7/1982 | Japan . |
| 62-176142 | 8/1987 | Japan . |

OTHER PUBLICATIONS

Frye et al., J. Electrochem. Soc.: Solid-State Science and Technology, vol. 133, No. 8 (Aug. 1987), pp. 1673-1677.

*Primary Examiner*—Olik Chaudhuri
*Assistant Examiner*—Ourmazd Ojan
*Attorney, Agent, or Firm*—Finnegan, Henderson, Farabow, Garrett, and Dunner

[57] ABSTRACT

According to the method of the present invention of manufacturing, from a semiconductor wafer, a dielectric substrate including insulated and separated island regions, a silicon oxide film is formed on a surface of a monocrystalline semiconductor wafer, and a mask consisting of a frame portion spreading on a peripheral region of the wafer and a grid-like portion arranged within the frame portion is formed. Then, in a patterning step, the surface of the wafer is exposed with the frame portion and the grid-like portion of the mask being left. Separation grooves arranged in a grid-like manner are formed in the exposed surface by etching. After a silicon oxide film is formed on the surfaces of the grooves, a polycrystalline semiconductor layer is made to grow on the silicon oxide film formed on the surfaces of the grooves and on the silicon oxide film formed on the surface of the wafer. The resultant structure is lapped from the side of the surface of the wafer such that the structure has a predetermined thickness as measured from a reference plane defined in the polycrystalline semiconductor layer, thus forming a plurality of island regions divided by the separation grooves.

2 Claims, 5 Drawing Sheets

F I G. 4A 
F I G. 4B 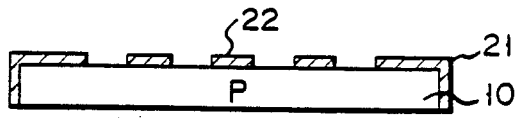
F I G. 4C 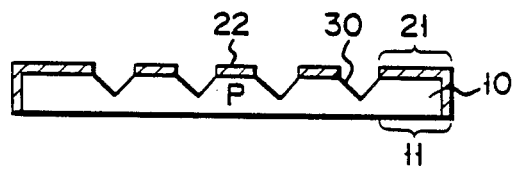
F I G. 4D 
F I G. 4E 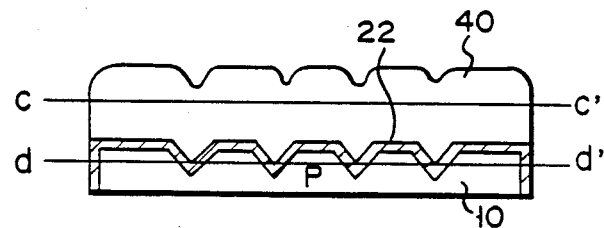
F I G. 4F 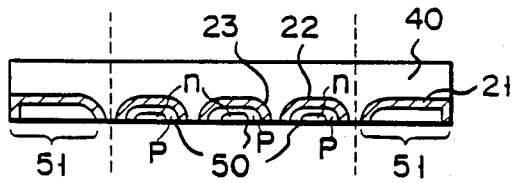

METHOD OF MANUFACTURING FROM A SEMICONDUCTOR WAFER A DIELECTRIC SUBSTRATE INCLUDING MUTUALLY INSULATED AND SEPARATED ISLAND REGIONS, AND A METHOD OF MANUFACTURING SEMICONDUCTOR ELEMENTS FROM THE DIELECTRIC SUBSTRATE

BACKGROUND OF THE INVENTION

1. Field of the Invention

The present invention relates to the improvement of a method of manufacturing, from a semiconductor wafer, a dielectric substrate including insulated and separated island regions and to a method of manufacturing semiconductor elements from the dielectric substrate, so as to obtain a high yield.

2. Description of the Related Art

FIGS. 2A to 2E show a conventional manufacturing method in which oxide film 20 is formed on semiconductor wafer 10 and is patterned so as to form oxide film 22 having a grid-like pattern shown in (FIG. 1).

Referring to FIG. 2A, silicon oxide film 20 is formed on the upper surface and side surface of semiconductor wafer 10. After a grid-shaped mask is formed on the upper surface of film 20, silicon oxide film 22 is formed having a grid-like pattern by means of a patterning step such as a photoresist technique. Next, with oxide film 22 being used as a mask, anisotropic etching is performed to form separation grooves 30 in the form of a grid over the upper surface of the wafer (FIG. 2B), after which silicon oxide film 23 is made to grow on the surfaces of grooves 30. Thereafter, oxide film 22 and oxide film 23 are covered on the entire surface of wafer 10 (FIG. 2C). As shown in FIG. 2C, oxide films 22 and 23 are subsequently designated as being a single entity by means of numeral 24.

In the step shown in FIG. 2D, polycrystalline silicon layer 40, serving as a support layer, is formed on oxide film 24 by subjecting a silicon chloride or the like to a gas-phase growth reaction.

Thereafter, layer 40 is lapped to a plane indicted by line a—a', and a reference plane is produced. Then, wafer 10 is lapped from the bottom side to a plane indicated by line b—b'. The resultant structure has a predetermined thickness spanning a distance between line a—a' and line b—b'.

FIG. 2E shows the resultant dielectric substrate having a plurality of monocrystalline island regions 50. Regions 50 have a predetermined depth and are separated by oxide film 24 covering the surfaces of grooves 30 and by silicon polycrystalline layer 40.

In the case of the above conventional method, the entire upper surface of the wafer is subjected to patterning to form grid-shaped silicon oxide film 22. As a result, grooves 30 are formed over the entire surface of the wafer, and inevitably on the peripheral region of the wafer, as shown in FIG. 1. Some of grooves 30 on the peripheral region may have defective shape. If the wafer suffers shock during manufacture, defective portion 31 would likely be produced, as shown in FIG. 2B.

When silicon polycrystalline layer 40 is made to grow on the semiconductor wafer 10, the growth rate of the peripheral area of layer 40 becomes, for example, higher than that of the central area of layer 40, so that the peripheral area of layer 40 will be thicker than the central area thereof, as shown in FIG. 2D. It would be difficult to precisely determine a reference plane (indicated by line a—a') for grinding layer 40. If line a—a' is inclined with respect to the bottom surface of wafer 10, and if wafer 10 is lapped from the bottom side thereof up to line b—b' with an equal distance being kept between line a—a' and line b—b', the resultant dielectric insulated substrate would then include island regions 50 having non-uniform thickness. If semiconductor elements are formed on such island regions 50, the semiconductor elements would have different characteristics, resulting in a low yield of excellent semiconductor elements.

SUMMARY OF THE INVENTION

The present invention aims to solve the above problem, and has as its object to provide a method of manufacturing a dielectric substrate, including mutually insulated and separated island regions, from a semiconductor wafer, wherein the depth of the island regions is equalized and a high manufacturing yield is thereby ensured, as well as to manufacturing semiconductor elements having uniform characteristics from the dielectric substrate.

In order to achieve the above object, the method of the invention comprises:

a step for forming an insulation film on a surface of a monocrystalline semiconductor wafer, and for forming a mask having a frame portion of predetermined size spreading on a peripheral region of the surface of the wafer, and a net-like portion arranged within the frame portion;

a patterning step for exposing the surface of the wafer in a grid-like manner, with the frame portion and the grid-like portion being left;

a step for etching the exposed surface of the wafer, thereby to form separation grooves arranged in a grid-like manner;

a step for forming an insulation film on the surfaces of the separation grooves;

a step for forming a polycrystalline semiconductor layer on the surface of the wafer and on the insulation film formed on the surfaces of the separation grooves; and a step for lapping the resultant structure from the surface of the wafer, so that the structure has a predetermined thickness as measured from a reference plane of the polycrystalline semiconductor layer, thereby to form a plurality of monocrystalline semiconductor island regions which are divided by the separation grooves arranged in the grid-like manner.

Using the above method, deformation of the peripheral area of the wafer can be prevented, and abnormal growth of the polycrystalline semiconductor layer on the wafer via the insulation film can be suppressed. As a result, the occurrence of nonuniformity in the depth of the island regions can be prevented in the lapping step, and semiconductor elements having uniform characteristics thus obtained.

BRIEF DESCRIPTION OF THE DRAWINGS

FIGS. 4A to 4F show the steps of the method of the invention for manufacturing a dielectric substrate including mutually insulated and separated island regions, and manufacturing semiconductor elements from the substrate.

DETAILED DESCRIPTION OF THE PREFERRED EMBODIMENTS

An embodiment of the present invention will now be described, with reference to FIG. 3 to FIG. 5H.

Figure 1:
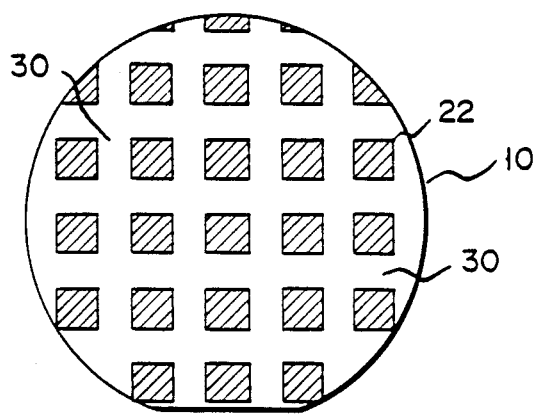
FIG. 1 is a plan view showing a mask pattern formed on a surface of a conventional semiconductor wafer.
Figure 3:
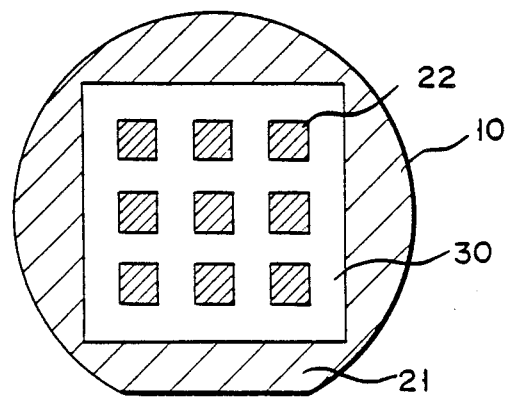
FIG. 3 is a plan view showing a mask pattern formed on a surface of a semiconductor wafer employed in an embodiment of the present invention.
Figure 2A:
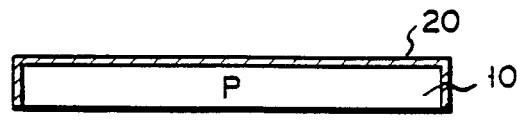
FIGS. 2A to 2E show the steps of manufacturing conventional semiconductor elements.
Figure 2B:
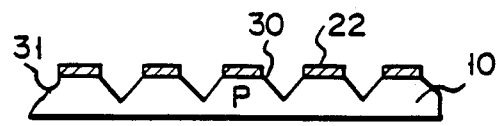
Figure 2C:
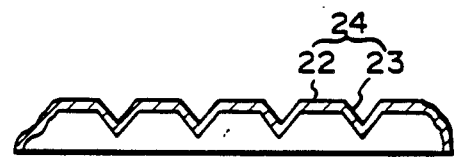
Figure 2D:
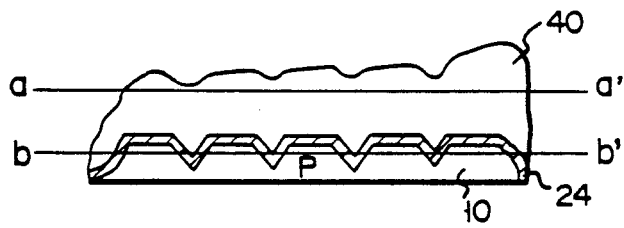
Figure 2E:
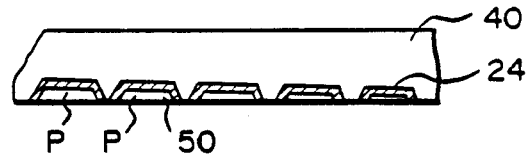

FIG. 3 and FIGS. 4A to 4F show a first embodiment of the present invention. Specifically, FIG. 3 shows a mask pattern for forming separation grooves, and FIGS. 4A to 4F show the steps of manufacturing a dielectric substrate in which mutually insulated and separated semiconductor elements are to be formed, and the steps of forming the semiconductor elements from the substrate.

FIG. 4A shows silicon monocrystalline wafer 10. Silicon oxide film 20 is formed on the upper surface and side surface of wafer 10 and is patterned by means of photoetching (FIG. 4B). As shown in FIG. 3, frame portion 21 lying on the peripheral region of wafer 10, and grid-like region 22 remain after completion of the photoetching, while the surface of wafer 10 is exposed.

By using frame portion 21 and grid-like region 22 as a mask, the exposed surface of wafer 10 is subjected to anisotropic etching, thereby forming separation grooves 30 arranged in a grid-like manner (FIG. 4C). In this case, it should suffice if silicon oxide films 20, 21 and 22 are thermal oxide films having a thickness of 5000 Å. In etching grooves 30, an alkaline etching liquid consisting of potassium hydroxide, pure water, isopropyl alcohol, and the like is used. The temperature of the liquid is about 80° C. The etching rate is about 1 μm/minute. Then, as shown in FIG. 4D, silicon oxide film 23 serving as an insulation/ separation film is made to grow on the surfaces of separation grooves 30. Silicon polycrystalline layer 40 serving as a support layer is formed on oxide films 21, 22 and 23 by a gas-phase growth reaction of a chloride of silicon or the like (see FIG. 4E). Polysilicon layer 40 is lapped to a plane indicated by c—c' in FIG. 4E. Then, wafer 10 is lapped to a plane indicated by line d—d', while a plane defined by line c—c' is employed as a reference plane. Thus, a dielectric substrate including mutually insulated/-separated island regions 50 is formed (FIG. 4F). In FIG. 4F, regions located outside broken lines serve as reinforcement portions, and are not used as elements. Impurities are diffused in island regions 50 located within the broken lines. Semiconductor elements such as diodes or transistors are formed in island regions 50. The semiconductor elements are separated from the substrate, one by one or group by group, by cutting the separation grooves.

As described above, since frame-shaped silicon oxide film 21 is left on the peripheral region of the wafer and no separation groove 30 is formed in this peripheral region, deformation in the peripheral portion of the wafer can be prevented, and abnormal growth of silicon polycrystalline layer 40 can also be prevented. The depth of island regions 50 is made uniform, and the semiconductor elements of uniform characteristics can be manufactured at a high yield.

Figure 5A:
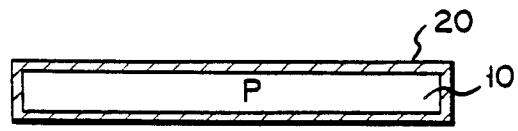
FIGS. 5A to 5H show the steps of a method according to another embodiment of the present invention.
Figure 5B:
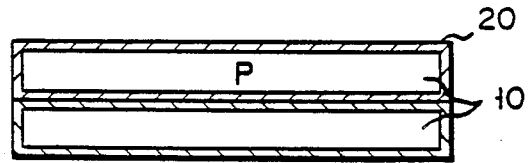
Figure 5C:
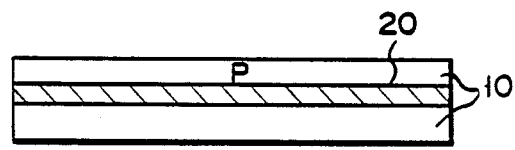
Figure 5D:
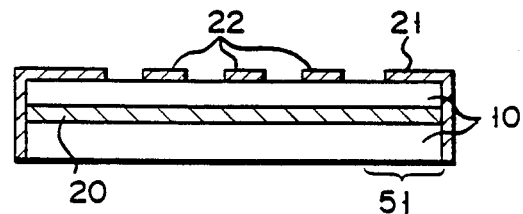
Figure 5E:
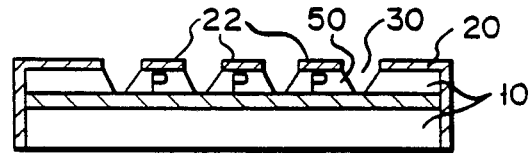
Figure 5F:
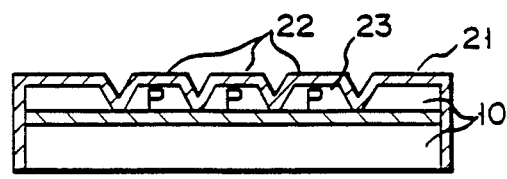
Figure 5G:
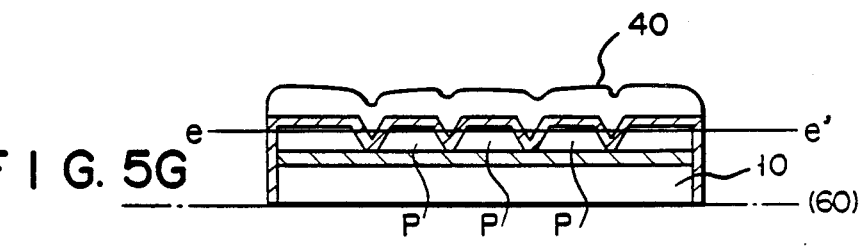
Figure 5H:
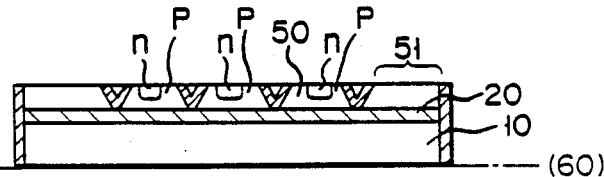

FIGS. 5A to 5H illustrate a second embodiment of the present invention. Two silicon wafers 10, each being coated with silicon oxide layer 20 (FIG. 5A), are superposed and attached on each other by heating them at 1100° C. for about for two hours (FIG. 5B). Oxide film 20 on the periphery of the united wafers 10 is removed by etching, and upper wafer 10 is lapped by a predetermined thickness (FIG. 5C). Oxide film 20 is interposed between wafers 10. As in the first embodiment, a mask consisting of frame portion 21 and net-like portion 22 is formed on wafer 10 (FIG. 5D). Grooves 30 are formed by means of etching (FIG. 5E). The bottom of each groove 30 reaches oxide film 20, and a plurality of island regions 50 may be formed. Oxide film 23 is made to grow on grooves 30 (FIG. 5F). Then, silicon polycrystalline layer 40 is made to grow on the resultant structure (FIG. 5G). The resultant structure is lapped from the side of layer 40 to a plane indicated by line e—e' which is determined from polished reference bottom surface 60 of lower wafer 10. In this manner, a dielectric substrate having a plurality of mutually insulated/-separated island regions 50 is manufactured, as shown in FIG. 5H.

In the above embodiment, polished reference surface 60 is a flat silicon surface. Since the depth of each island region 50 can easily be determined by lapping upper wafer 10 in the step of FIG. 5C, the uniformity in depth of island regions 50 is precise. In a lapping machine used in the lapping step, an inclination of a grindstone is adjustable with respect to a support member for the grindstone. Since silicon oxide film 21 is harder than silicon polycrystalline layer 40, the position of the the grindstone is flattened when it abuts upon oxide film 21. Therefore, uniform grinding can be performed, and the yield of island regions 50 can be increased.

What is claimed is:

1. A method of manufacturing a dielectric insulated/-separated substrate from a semiconductor wafer, comprising:
    a step of bonding a first monocrystalline semiconductor wafer and a second monocrystalline semiconductor wafer, with a first insulation film being interposed between said first and second wafers;
    a step of lapping the first monocrystalline semiconductor wafer by a predetermined thickness;
    a mask forming step of forming a mask, having a frame portion with a predetermined width arranged along a peripheral region of the first monocrystalline semiconductor wafer and a grid-like portion arranged within the frame portion, by forming a second insulation film on a surface of the first monocrystalline semiconductor wafer;
    a patterning step of exposing, on the basis of said mask forming step, the surface of the first monocrystalline semiconductor wafer in a grid-like manner, with the frame portion and the grid-like portion remaining;
    a step of forming separation grooves in a grid-like manner, to such a depth that the separation grooves reach the first insulation film, by etching the surface of the semiconductor wafer exposed in the grid-like manner by said patterning step;
    a step of formimg an insulation film on the surfaces of the separation grooves;
    a step of forming a polycrystalline semiconductor layer on said remaining frame portion arranged along the peripheral region of the first monocrystalline semiconductor wafer, and on said grid-like portion on the first monocrystalline semiconductor wafer, and further on the insulation film formed on the surfaces of the separation grooves; and a step of forming a plurality of monocrystalline island regions, into which the wafer is divided by the separation grooves formed in the grid-like manner, by lapping so as to have a predetermined thickness as measured from a reference bottom surface of one of the first and second monocrystalline semiconductor wafers.

2. A method of manufacturing a dielectric insulated/-separated substrate from a semiconductor wafer, comprising:

a step of bonding a first monocrystalline semiconductor wafer and a second monocrystalline semiconductor wafer, with a first insulation film being interposed between said first and second wafers;

a step of lapping the first monocrystalline semiconductor wafer by a predetermined thickness;

a mask forming step of forming a mask, having a frame portion with a predetermined width arranged along a peripheral region of the first monocrystalline semiconductor wafer and a grid-like portion arranged within the frame portion, by forming a second insulation film on a surface of the first monocrystalline semiconductor wafer;

a patterning step of exposing, on the basis of said mask forming step, the surface of the first monocrystalline semiconductor wafer in a grid-like manner, with the frame portion and the grid-like portion remaining;

a step of forming separation grooves in a grid-like manner, to such a depth that the separation grooves reach the first insulation film, by etching the surface of the semiconductor water exposed in the grid-like manner by said patterning step;

a step of forming an insulation film on the surfaces of the separation grooves;

a step of forming a polycrystalline semiconductor layer on said remaining frame portion arranged along the peripheral region of the first monocrystalline semiconductor wafer, and on said grid-like portion on the first monocrystalline semiconductor wafer, and further on the insulation film formed on the surfaces of the separation grooves;

a step of forming a plurality of monocrystalline island regions, into which the wafer is divided by the separation grooves formed in the grid-like manner, by lapping so as to have a predetermined thickness as measured from a reference bottom surface of one of the first and second monocrystalline semiconductor wafers; and a step of forming a semiconductor element in each of the monocrystalline semiconductor island regions, and cutting off semiconductor integrated elements formed of the island regions from the semiconductor wafer.

* * * * *